(12) United States Patent
Palmgren

(10) Patent No.: US 6,288,552 B1
(45) Date of Patent: Sep. 11, 2001

(54) GMR SENSOR TESTER FOR HEATED WINDOW GRIDS

(75) Inventor: Tris Palmgren, Grosse Pointe Woods, MI (US)

(73) Assignee: DaimlerChrysler Corporation, Auburn Hills, MI (US)

( * ) Notice: Subject to any disclaimer, the term of this patent is extended or adjusted under 35 U.S.C. 154(b) by 0 days.

(21) Appl. No.: 09/430,743

(22) Filed: Oct. 29, 1999

(51) Int. Cl.$^7$ .................................................. G01R 31/00
(52) U.S. Cl. ............................................................ 324/505
(58) Field of Search ............................... 324/66, 67, 503, 324/505, 529, 539, 540

(56) References Cited

U.S. PATENT DOCUMENTS

| | | |
|---|---|---|
| 4,217,783 | 8/1980 | Ito et al. . |
| 4,395,677 | 7/1983 | Petersdorf . |
| 4,542,333 | 9/1985 | Koontz . |
| 4,610,710 | 9/1986 | Koontz . |

*Primary Examiner*—Walter E. Snow
(74) *Attorney, Agent, or Firm*—Mark P. Calcaterra

(57) ABSTRACT

A tester to test operation of the electrical conductors of a heated window grid. The tester includes a giant magnetoresistive sensor passed over the grids to generate a varying electromagnetic signal. The electromagnetic signal is differentiated over the distance moved by the sensor by comparing the actual signal to a delayed version of a previous, actual signal. The actual and delay signal are subtracted to define a difference signal. The difference signal is then compared against thresholds to define high and low windows. The relative position of the high and low windows determines whether the sensor has passed over a properly functioning electrical conductor.

17 Claims, 8 Drawing Sheets

Fig-2C

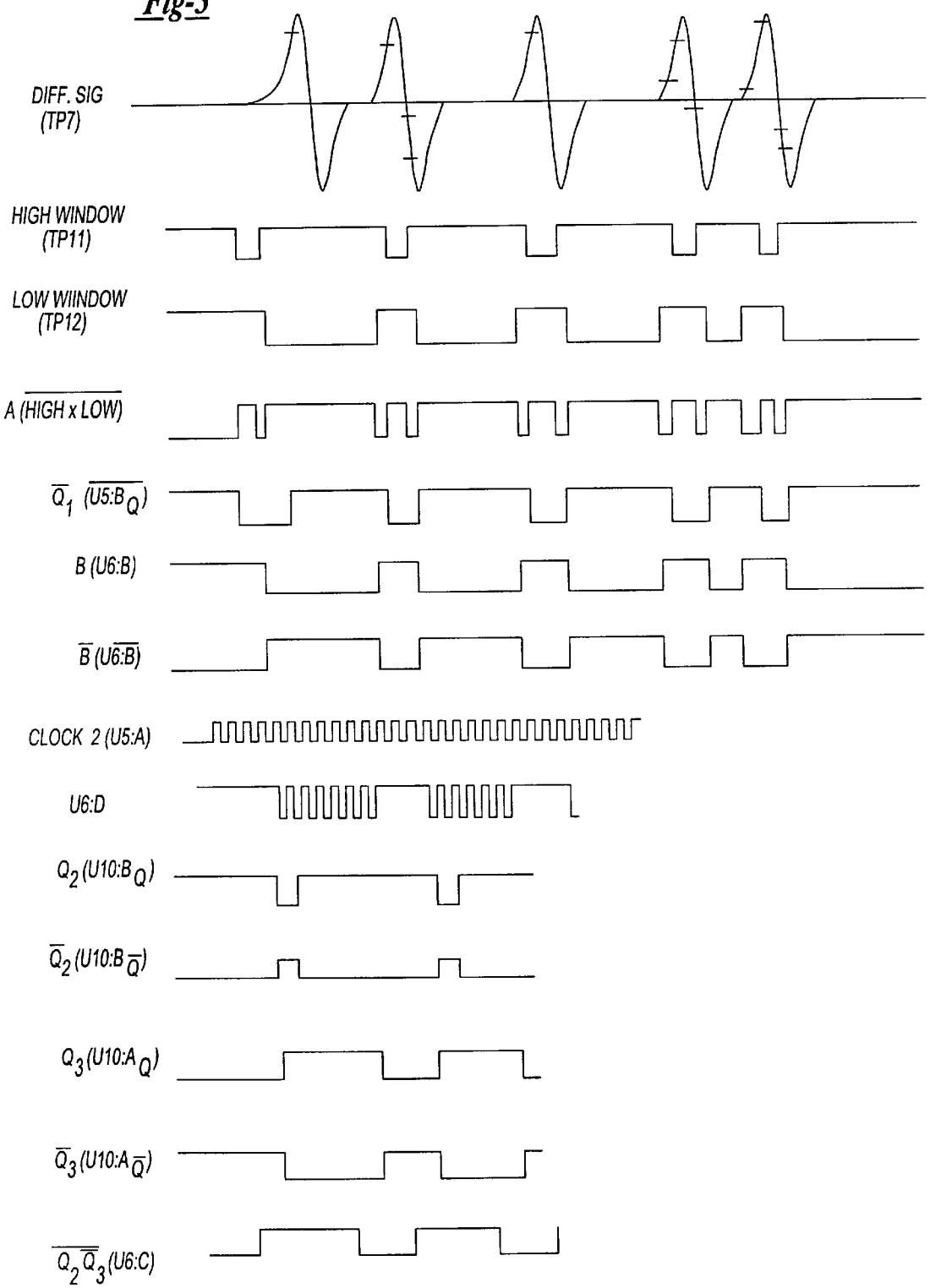

GMR SENSOR TESTER FOR HEATED WINDOW GRIDS

FIELD OF THE INVENTION

The present invention relates generally to a sensor for detecting current flow in an electrical conductor, and more particularly to a tester for heated window grids using a giant magnetoresistive (GMR) sensor to generate an output signal from which current flow in the electrical conductors can be determined.

BACKGROUND

Most passenger vehicles include some form of defogger or deicer arranged on the rear window or backlight. The defogger or deicer is implemented by placing a grid along the back window, typically horizontally, using conductive inks printed on the interior of the rear window. An electric current is passed through the grid to generate heat which sufficiently defogs or deices the window.

In order to insure production of a quality vehicle, automobile manufacturers typically test the grid to insure that each individual electrical conductor or line of the grid conducts current to insure proper operation. Because the grid is located on the interior of the window and manufacturers prefer to test the grid after installation of the window to the vehicle body, direct testing of the grid, such as by testing voltage across the end portions of each particular grid line requires assembly personnel to get into the back seat of the vehicle to conduct the test. Manufacturers prefer to avoid having the assembly personnel enter the vehicle to minimize the introduction of dust, debris, and dirt into the vehicle. Such testing can also be time consuming, as it requires that an operator enter the vehicle, conduct a test on each grid line, and exit the vehicle before proceeding to test the grid of the next vehicle having a heater grid. Further, such a process requires an operator strictly dedicated to performing this function.

One approach to making the testing process more efficient is discussed in U.S. Pat. No. 4,395,677, issued Jul. 26, 1993 and assigned to the assignee of the present invention, and which is hereby incorporated by reference. The approach discussed in this patent utilizes a pair of Hall effect sensors to test for current flow through each electrical conductor of the rear window heated grid in order to avoid having assembly personnel enter the vehicle on the assembly line. The solution produced by this system, requires two Hall effect sensors spaced apart a predetermined distance. This system, however, requires that the sensor be passed over the grid within a predetermined range of speeds, outside of which can produce inaccuracies within the system. Further, this system has been found to be sensitive to external magnetic fields introducing possibly inaccurate readings.

Thus, it is an object of the present invention to provide a tester for heated window grids which can be passed over the grid without regard to the speed at which it is passed over the grid.

It is a further object of the present invention to provide a more robust tester for heated window grids which is relatively unaffected by external electromagnetic fields.

SUMMARY OF THE INVENTION

This invention is directed to an apparatus for detecting energization of individual electrical conductors of a plurality of generally parallel, adjacent electrical conductors. The apparatus includes a magnetic sensor which is passed over the electrical conductors. The magnetic sensor generates an output signal in accordance with variation in the magnetic field as the sensor passes over the electrical conductors. A delay element receives the output signal and delays the output signal for a predetermined period to define a delay signal. An adder determines the difference between the output signal and the delay signal to define a difference signal. A high window comparator determines whether the difference signal is above a predetermined threshold and generates a high window signal in accordance with the difference signal. A low window comparator determines whether the difference signal is below a predetermined threshold and generates a low window signal in accordance with the difference signal. A control circuit compares the high window signal and the low window signal and generates an increment signal in accordance with the low and high window signals. A counter receives the increment signal and increments in accordance with the increment signal.

Further areas of applicability of the present invention will become apparent from the detailed description provided hereinafter. It should be understood however that the detailed description and specific examples, while indicating preferred embodiments of the invention, are intended for purposes of illustration only, since various changes and modifications within the spirit and scope of the invention will become apparent to those skilled in the art from this detailed description.

BRIEF DESCRIPTION OF THE DRAWINGS

The present invention will become more fully understood from the detailed description and the accompanying drawings, wherein:

FIGS. 2a–2f combin to form a schematic circuit diagram of the block diagram of FIG. 1; and FIG. 3 is a timing diagram of the operation of the logic portion of the present invention.

DETAILED DESCRIPTION OF THE PREFERRED EMBODIMENTS

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

Figure 1:
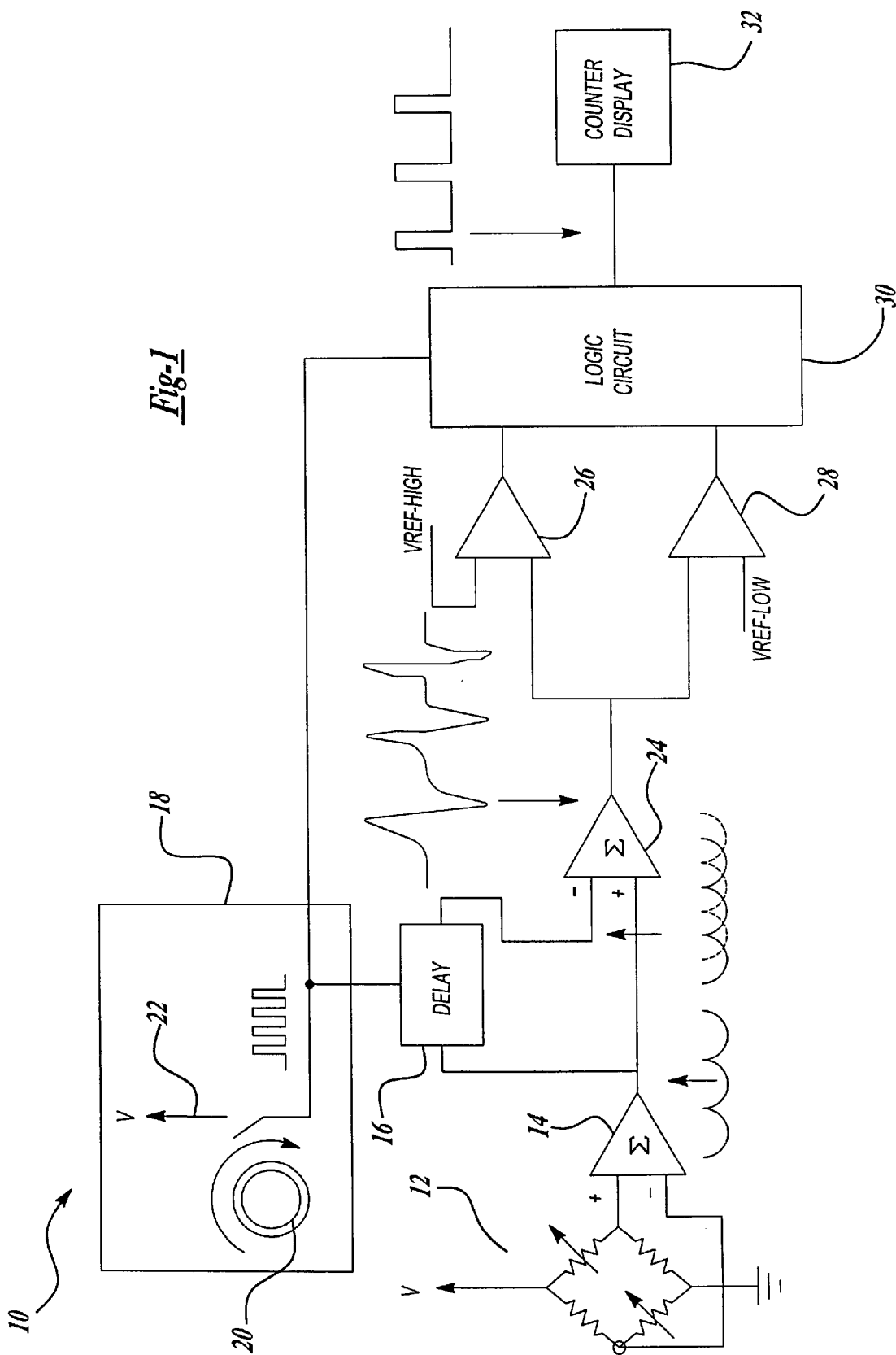
FIG. 1 is a block diagram of the tester for heated window grids arranged in accordance of the principles of the present invention.

The subject invention will be explained with respect to FIGS. 1–3. With particular respect to FIG. 1, FIG. 1 is a block diagram of the heated window grid tester system 10 arranged in accordance with the principles of the present invention. The heated window grid tester system 10 includes an electromagnetic sensor 12, preferably embodied as a giant magnetoresistive (GMR) sensor. As will be described in greater detail herein, GMR sensor 12 is embodied as a Wheatstone bridge sensor having two shielded GMR resistors acting as reference resistors and two unshielded GMR resistors exposed to external electromagnetic fields acting as sense resistors. GMR sensor 12 outputs a voltage input to the respective inverting and non-inverting terminals of an amplifier 14 to amplify the output signal from GMR sensor 12. The output from amplifier 14 is input to a delay circuit 16.

Delay circuit 16 receives a clock signal from clock 18. The clock signal output by clock 18 varies in accordance with the distance displaced by GMR sensor 12. Clock 18 includes a wheel 20 which rotates as GMR sensor 12 traverses the heated window grid. As wheel 20 rotates, wheel 20 causes alternate opening and closing of a switch 22, thereby generating the clock signal output by clock 18. Wheel 20 and switch 22 may be implemented as a wheel and photo diode/phototransistor pair as are commonly employed on computer mice.

Delay element 16 delays the signal received from amplifier 14 by a predetermined number of clock pulses and outputs the delayed signal to the inverting input of adder 24. The noninverting input of adder 24 also receives the output of amplifier 14 directly. Adder 24 thus outputs a difference signal representing the difference between the present output of amplifier 14 and the delay signal output by delay element 16. The difference signal output from adder 24 is input to a high window comparator 26 and a low window comparator 28. High window comparator 26 compares the difference signal to the reference voltage, to define a high window. Similarly, low window comparator 28 compares the difference signal to a low reference voltage, to define a low window. High window comparator 26 outputs a low signal when the difference signal exceeds the high reference voltage, and low window comparator 28 outputs a low signal when the difference signal is less than the low reference voltage. The high and low window signals are input to logic circuit 30.

Logic circuit 30 receives the high window and the low window signals. Logic circuit 30 also receives the clock signal output by clock 18. Logic circuit 30 compares the high and the low window signals to make determinations about when GMR sensor 12 has passed over a properly operating electrical conductor. Logic circuit 30 outputs an increment signal when GMR sensor 12 has passed over a properly operating electrical conductor. The increment signal is input to counter/display 32. The counter portion of counter/display 32 increments upon detection of an increment signal. The display preferably outputs a value indicating the number of properly functioning electrical conductors traversed by GMR sensor 12. The display portion of counter/display 32 may also use an indicator light to indicate that GMR sensor 12 has passed over a properly functioning electrical grid.

FIGS. 2a–2f combine to form a schematic circuit diagram for the components of FIG. 1. With particular respect to FIG. 2a, operation of clock 18 will be described herein. At the outset, it should be noted that the values for each element or integrated circuit package designation in FIGS. 2a–2f define a preferred embodiment of practicing the invention. Heated window grid tester system 10 includes a start-up or reset circuit to enable clock 18 to generate clock pulses prior to operation of other portions of the circuit in order to initially gate a signal through delay element 16. As will be described in greater detail, when the sensor portion of window grid tester system 10 is placed against the window having a grid to be tested, a reset mode is activated.

During reset a 5 volt (5V signal), a signal slightly less than 5 volts (Vcc), and 9 volt (9V) signal are generated. The 5V and Vcc signals are applied either directly or indirectly to selected terminals of metal oxide semiconductors (MOSFETs) M1, M2, and M3. Upon application of the 5V signal to capacitor C1, the gate voltage of MOSFET M1 rises, turning on MOSFET M1, pulling the gate voltages of MOSFETS M2 and M3 to ground. When the gate voltages of MOSFETS M2 and M3 drop to GND, MOSFET M2 and M3 are turned on. Turning on MOSFET M2 causes a resultant 5V signal to appear at the negative terminal of light emitting diode (LED) D1. This causes LED D1 to remain off, as a 5V potential appears at both the positive and negative terminals of LED D1. Activation of MOSFET M3 activates astable multivibrator 40. Activation of MOSFET M3 provides a current path from 5V through M3, resistor R4, and resistor R9 to ground. This results in approximately half of the 5V signal being applied to the noninverting input of operational amplifier (op amp) U1:A. This generates a high voltage output signal at the output of U1:A which charges capacitor C2 via resistor R5. As capacitor C2 charges to a high voltage, the voltage applied to the inverting input of op amp U1:A eventually exceeds the voltage applied to the noninverting input, thereby causing op amp U1:A to generate a low voltage signal, thereby discharging capacitor C2. This process simulates a clock signal being applied to the inverting input of op amp U:1C. After a predetermined time period, preferably 300 milliseconds, the gate voltage applied to mosfet M1 drops below a predetermined threshold, turning off mosfet M1. The voltage at RESET* thus goes high, thereby preventing a current flow in MOSFETS M2 and M3, thereby disabling astable multivibrator 40.

After the initial reset period, clock 18 generates a clock signal in accordance with displacement of GMR sensor 12 which causes corresponding rotation of wheel 20 of FIG. 1. Wheel 20 preferably has apertures and is inserted between LED D1 and phototransistor M4 so that rotational movement of wheel 20 causes apertures in wheel 20 to alternately enable and disable light flow between LED D1 and phototransistor M4. When phototransistor M4 detects light, phototransistor M4, turns on, providing a current flow from 5V through phototransistor M4, resistor R7, resistor R8, and resistor R9 to GND. The existence of this current path results in high voltage signal being applied to the inverting input of op amp U1:C. Reference voltage VREF1 is applied to the noninverting input of op amp U1:C. Op amp U1:C inverts and squares the signal applied to the inverting input. A resistor R13 provides a feedback loop from the output of op amp U1:C to the noninverting input to provide hysteresis for the input.

Reference voltage VREF1 is determined in accordance with a voltage signal output from potentiometer R11 which is inserted between the 9V signal and GND. Potentiometer R11 can be adjusted to vary reference voltage VREF1 input to the noninverting input of op amp U1:C. Reference voltage VREF1 is also input to the noninverting input of comparator U4:A. The output from U1:C is input to the inverting input of comparator U4:A. Comparator U4:A inverts and squares the signal input to the inverting input of comparator U4:A. A pull-up resistor R25 is inserted between 9V and the output of comparator U4:A. The signals at nodes TP6 and TP10 thus provide two out-of-phase clock pulses. Out-of-phase clock pulses TP6 and TP10 are input to delay circuit 16, as will be described in further detail herein. Clock pulse TP6 is also input to logic circuit 30, as will also be described herein.

Figure 2A:
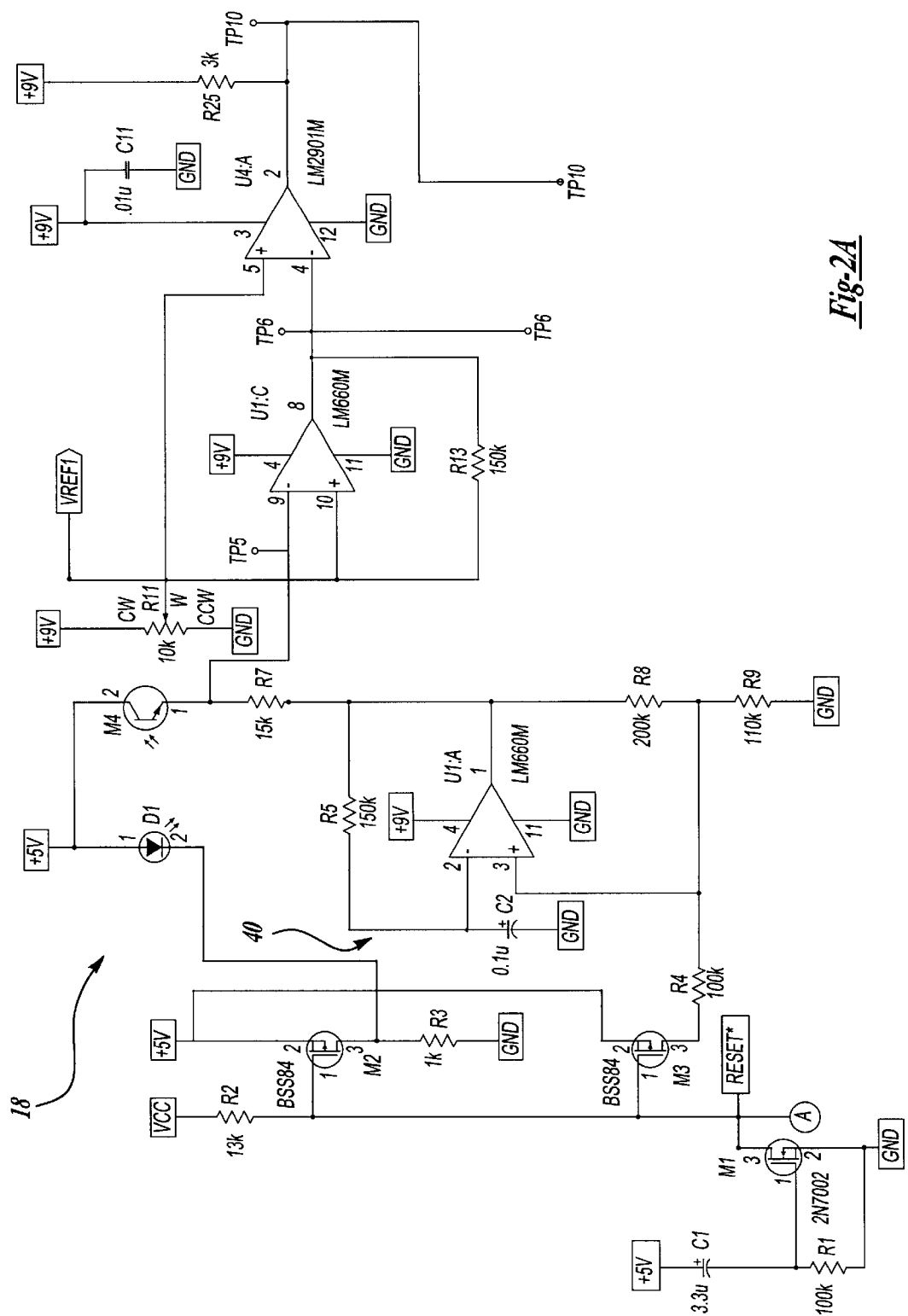
Figure 2B:
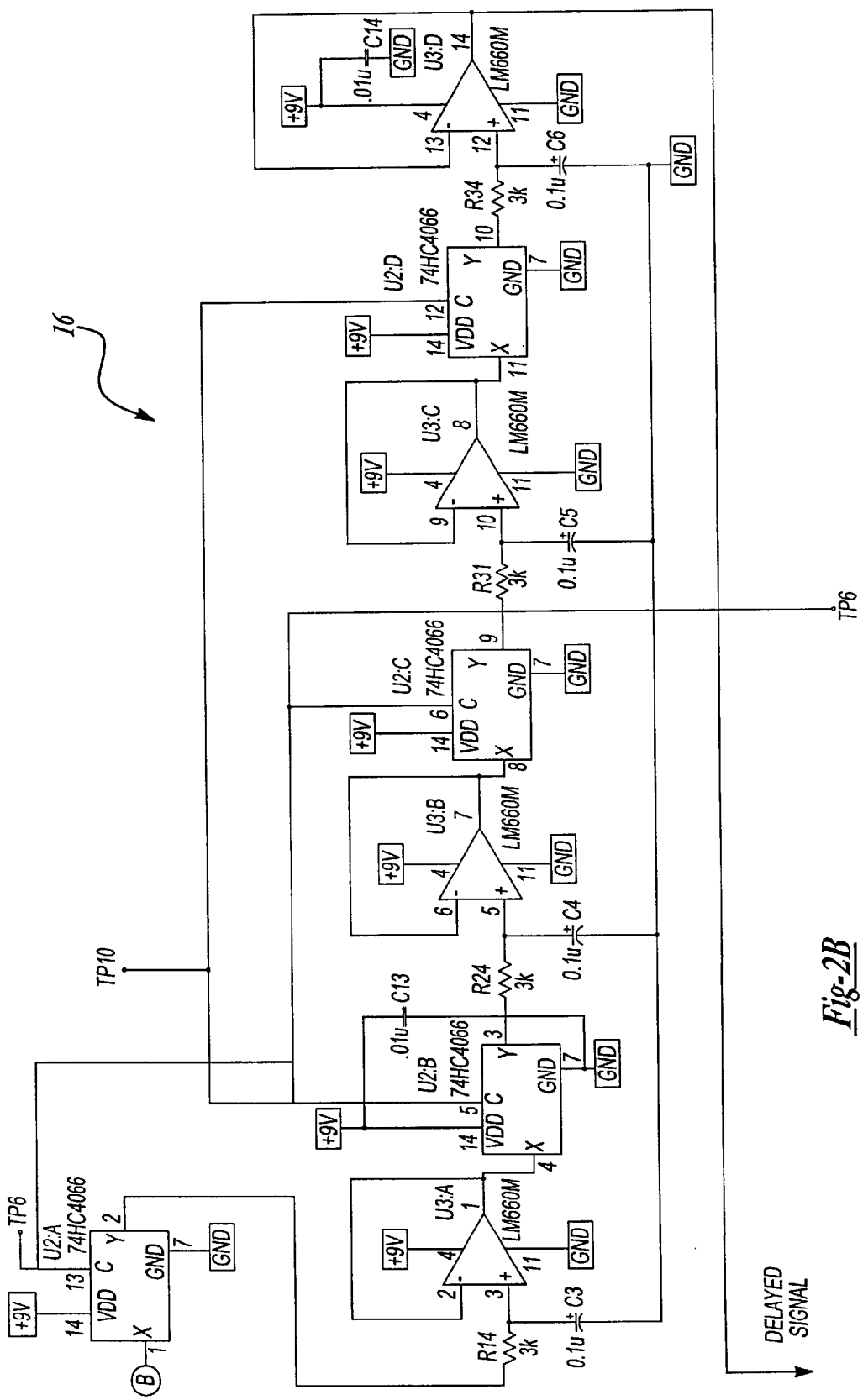
Figure 2C:
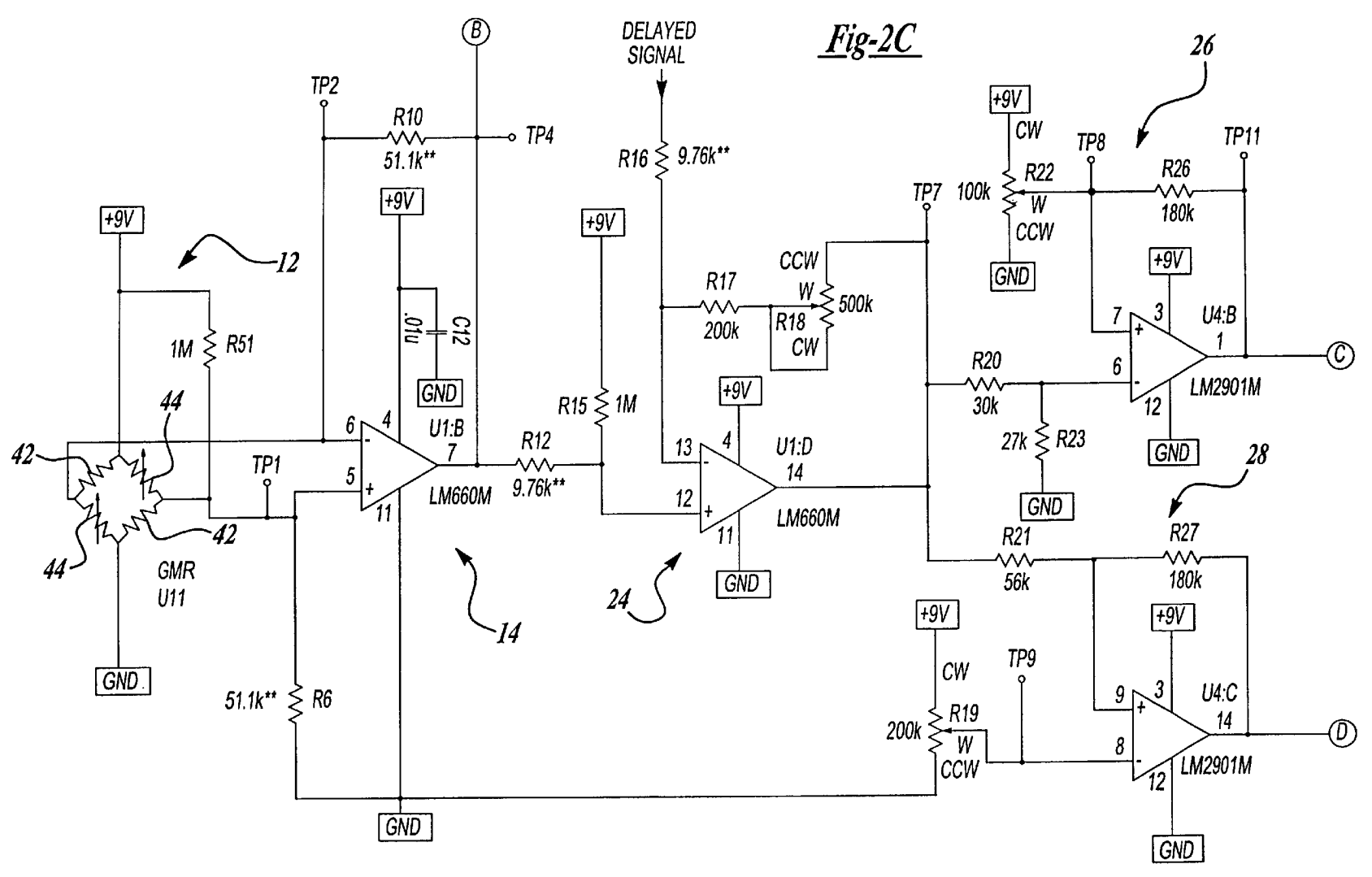

FIGS. 2b and 2c cooperate to describe the operation of GMR sensor 12 and delay circuit 16. GMR sensor 12 is shown in FIG. 2c as GMR U11. Four GMR resistors form GMR U11 and are arranged in a Wheatstone bridge configuration. Two GMR resistors 42 are shielded so as to be unaffected by magnetic field. Two other GMR resistors 44 are unshielded and have resistances which vary in accordance with the magnetic field. A resistor R51 is inserted between 9V and the output of GMR U11 in order to provide an offset voltage on the order of approximately 24 millivolts (mV). The output from GMR U11 with the 24 mV offset is applied to the noninverting input of op amp U1:B. Op amp U1:B amplifies the signal output by GMR U11. Resistor R10 operates as a feedback resistor from the output to the inverting input of U1:B. A matched resistor R6 connects the noninverting input of op amp U1:B to ground. Resistors R6 and R10 are preferably 1% resistors and also preferrably suitable match impedances applied to the inputs of op amp U1:B. The output from op amp U1:B is applied to the noninverting input of op amp U1:D through 1% resistor R12. Resistor R15 interconnects between 9V and the noninverting terminal of U1:D and provides an approximate 4.5V offset to the signal input to the noninverting input U1:D to insure that the voltage at the noninverting input always exceeds the voltage at the inverting input of U1:D. The inverting input of U1:D receives a delayed version of the signal output by U1:B delayed by a predetermined number of clock pulses. In this particular application, four clock pulse comprises to the delay. Clock signals TP6 and TP10, which are respectfully out-of-phase cooperate to alternatively operate a series of cascaded delay elements in order to effect the four clock pulse delay implemented by delay circuit 16.

The signal output by U1:B for delay is applied to the input of analog switch U2:A. Upon TP6 going high, the signal applied to the input of analog switch U2:A is gated through to the output of analog switch U2:A. The output of analog switch U2:A is applied to a resistor-capacitor (RC) circuit comprising resistor R14 and capacitor C3. The positive terminal of capacitor C3 is connected to the noninverting terminal of op amp U3:A which is arranged to form a buffer circuit. The output from op amp U3:A is fed back to the inverting terminal. Thus, analog switch U2:A, resistor R14, capacitor C3, and op amp U3:A form a sample and hold circuit. The voltage of capacitor C3 is passed through op amp U3:A and applied to the input of analog switch U2:B.

Clock signal TP10 provides a clock input to analog switch U2:B. Because clock signals TP6 and TP10 are out of phase, when switch U2:A is activated, switch U2:B is deactivated and vice versa. Similarly as described above with respect to analog switch U2:A and op amp U3:A, when clock signal TP10 goes high, the voltage applied at the input of analog switch U2:B passes through analog switch U2:B to the output terminal. The output of analog switch U2:B powers an RC circuit comprising resistor R24 and capacitor C4. As described above with respect to op amp U3:A, op amp U3:B functions as a buffer circuit to ensure that the output signal is the same as the input signal applied to the noninverting input. Analog switch U2:C and op amp U3:C operates as described above with respect to analog switch U2:A and op amp U3:A and is clocked in accordance with clock signal TP6. Analog switch U2:D and op amp U3:D operate as described above with respect to analog switch U2:B op amp U3:B and is clocked in accordance with clock signal TP10. Delay circuit 16 thus effects a four pulse delay in the signal input to delay circuit 16 from amplifier 14.

The output from delay circuit 16 is input to the inverting input of op amp U1:D through resistor R16. Thus, op amp U1:D outputs a difference signal between the present signal output from op amp U1:B and a signal previously output by op amp U1:D delayed by four pulses. As described above, resistor R15 is connected between the 9V and the noninverting inputs of U1:D in order to offset the voltage input to the noninverting input of U1:D by a predetermined value, approximately 4.5V. This insures that the noninverting input will exceed the inverting input. Both the delayed signal and the current signal are input to the respective inverting and noninverting inputs of op amp U1:D through a pair of matched resistors R12, R16 in order to properly match impedances at the respective inputs. The output from op amp U1:D is fed back to the inverting input of U1:D through potentiometer R18 and feedback resistor R17 to provide adjustable gain. The difference signal output by op amp U1:D is input to the inverting input of a high window comparator U4:B (26) through resistor R20. Similarly, the difference signal is input to the noninverting input of a low window comparator U4:C (28) through resistor R21.

The threshold points for the high window comparator U4:B are determined in accordance with selection of a resistance value obtained by adjusting potentiometer R22 and in accordance with feedback resistor R26. Window comparator 26 is arranged to operate in an active low mode, outputting a high voltage signal when the difference signal is less than a predetermined threshold and outputting a low voltage signal when the difference signal exceeds a predetermined threshold. Resistor R26 provides hysteresis so that the threshold voltage for causing comparator U4:B to output a high signal differs from the voltage threshold for causing comparator U4:B to output a low signal. In particular, $V_{HI}^+$ defines a voltage at which comparator U4:B outputs a low signal voltage as the difference signal transitions from low to high through $V_{HI}^+$. Similarly, $V_{HI}^-$ defines a voltage at which comparator U4:B outputs a high voltage as the difference signal transitions from high to low through $V_{HI}^-$. Thus, comparator U4:B utilizes two crossover points to determine whether comparator U4:B outputs a high or a low signal.

Similarly, low window comparator 28 has a voltage applied to the inverting terminal determined in accordance with the setting of potentiometer R19. The difference signal output by op amp U1:D is applied to the noninverting input comparator U4:C. Low window comparator 28 is arranged to provide an active low signal based upon the difference signal. That is, active low window comparator 28 outputs a high voltage in response to the difference signal being above a predetermined threshold and outputs a low voltage in response to the difference signal below a predetermined threshold. Further, feedback resistor R27 provides hysteresis at the noninverting input of comparator U4:C, thereby providing two threshold voltages depending upon whether the difference signal is increasing or decreasing. Accordingly, a first voltage $V_{LO}^-$ defines a voltage at which the output from comparator U4:C goes low as the difference signal transitions from high to low through $V_{LO}^-$. Similarly, a low voltage $V_{LO}^+$ defines a threshold voltage from low to high through $V_{LO}^+$ at which window comparator 28 outputs a high voltage signal. The outputs from high window comparator U4:B and low window comparator U4:C are input to logic circuit 30.

Figure 2D:
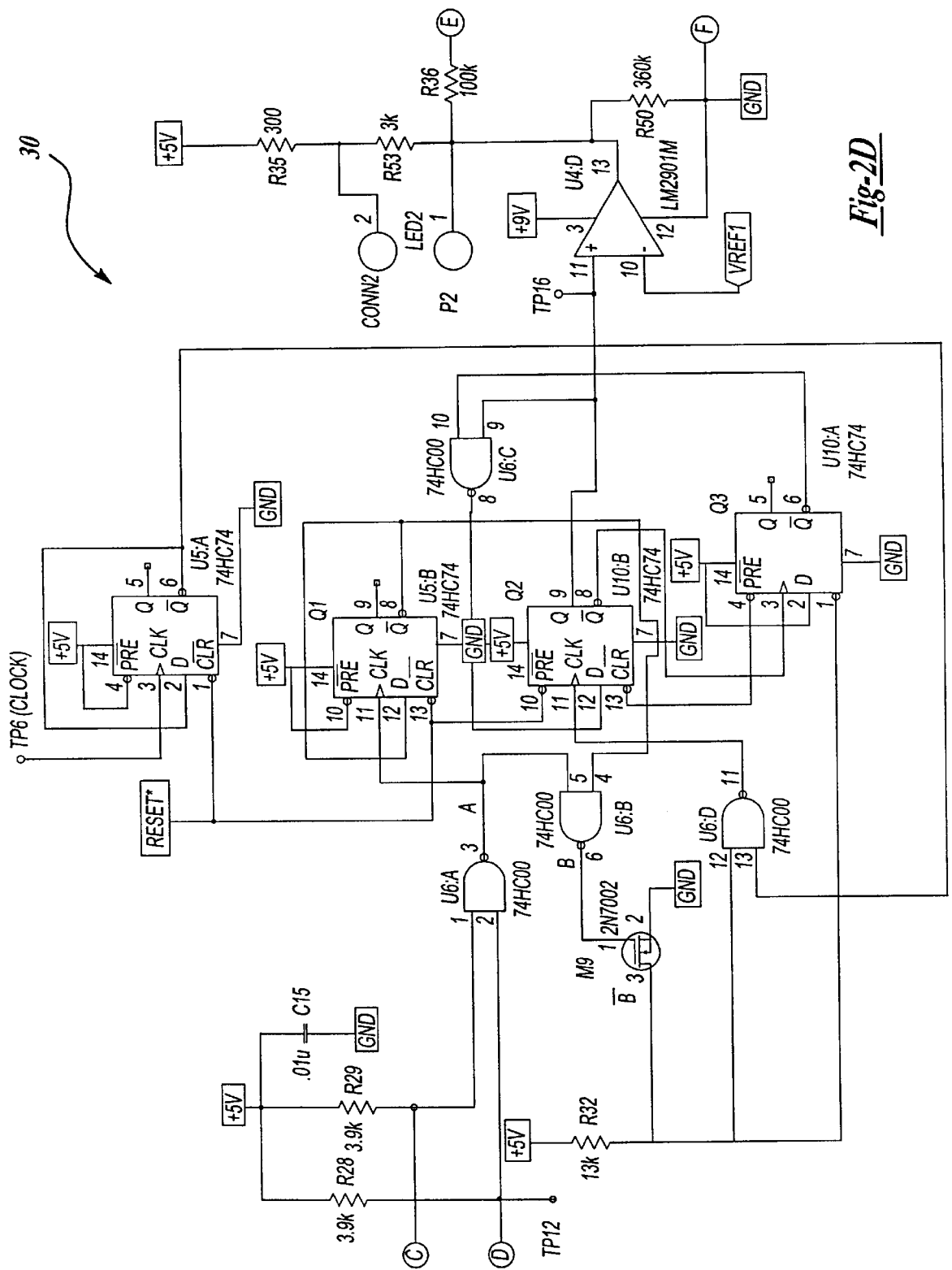
Figure 2E:
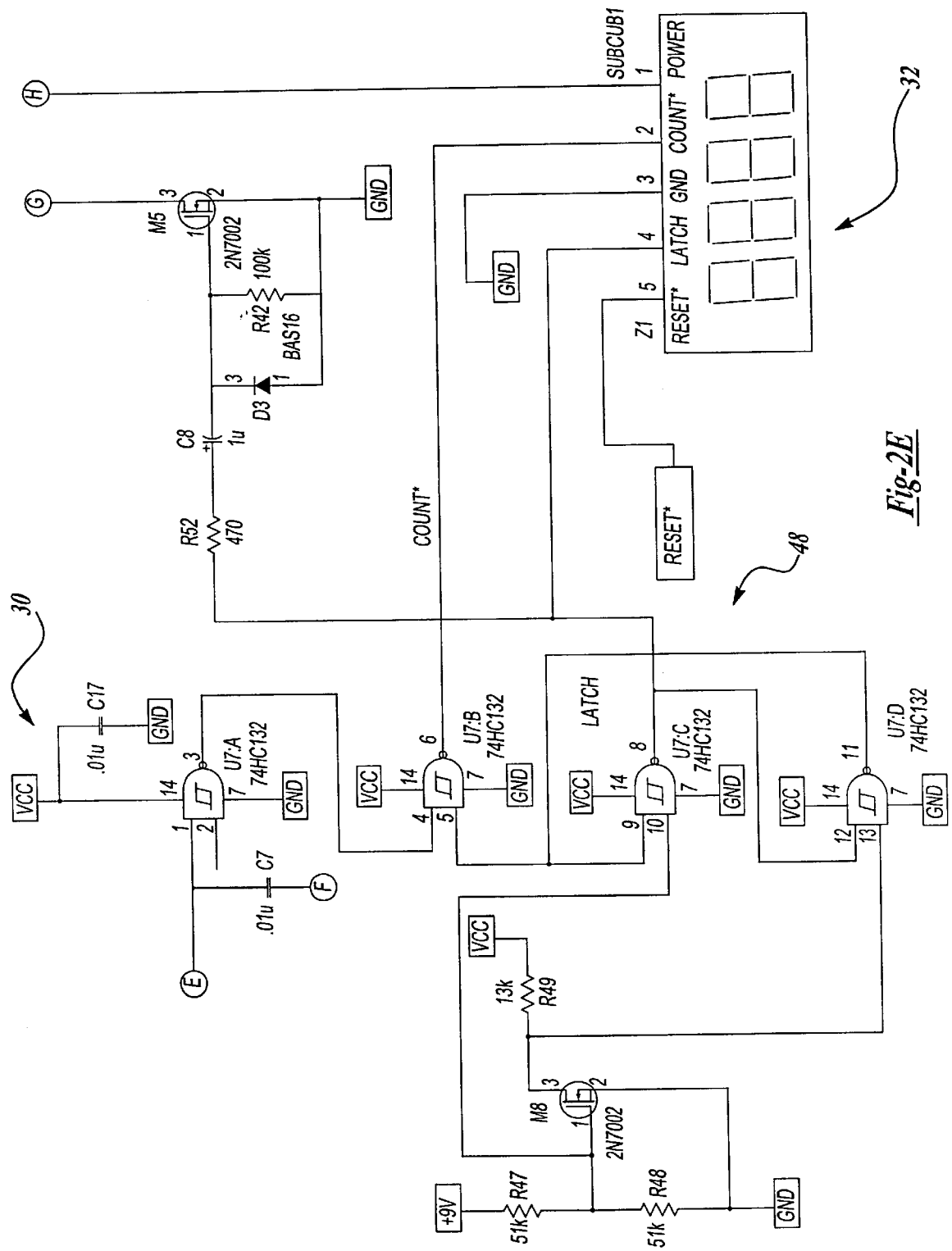

FIGS. 2d and 2e depict logic circuit 30 of FIG. 1. FIGS. 2d and 2e will be described in connection with the timing diagram of FIG. 3. With reference to FIG. 1, FIG. 1 depicts two exemplary waveforms output by GMR sensor 12 when passed over a heated window grid. The waveform depicted as a solid line represents the signal output by GMR sensor 12. The peaks indicate GRM sensor 12 passing directly over an electrical conductor having current flowing therethrough. The waveform depicted in phantom in FIG. 1 represents the delay signal of the actual waveform. The waveform representing the output signal of GMR sensor 12 represents current flowing in a first direction through the electrical conductors of the heater grid. For current flowing in the opposite direction, the waveforms will be represented as symmetric about a horizontal line, with the peaks pointing downward. When GMR sensor 12 passes over an electrical conductor which is not conducting electricity, such as because of a short circuit, no peak corresponding to that electrical conductor appears.

FIG. 3 next depicts a difference signal as can be detected at TP7. FIG. 3 next depicts the output of the respective high and low window comparators 26, 28 as can be detected at respective points TP11 and TP12. The output from the window comparators 26, 28 is input to NAND gate U6:A. A waveform of the output of U6:A appears at A of FIG. 2d may be seen in FIG. 3 at A. The output from NAND gate U6:A is input to NAND gate U6:B and to the clock input of flip flop Q1. A second input to NAND gate U6:B is received from the $\overline{Q}$ output of flip flop Q1 (U5:B). Flip flop Q1 acts as a divide-by-two for the signal A output from NAND gate U6:A. The output B from NAND gate U6:B is then input to an inverter M9, embodied as an N-channel enhancement MOSFET. The output from inverter M9 is then input to NAND gate U6:D. A second input to NAND gate U6:D is supplied by filp flop U5:A which functions as a divide-by-two circuit for the clock signal TP6. The output from NAND gate U6:D is applied to the clock input of flip flop Q2 (U10:B). The Q output of flip flop Q2 is input to NAND gate U6:C and to the noninverting input of comparator U4:D. The Q output from flip flop Q2 is generally defined as the increment signal, as discussed with respect to FIG. 1. A second input to NAND gate U6:C is provided by the $\overline{Q}$ output of flip flop Q3 (U10:A). A signal is applied to the $\overline{CLR}$ input of flip flop Q3 based on the output of inverter M9. Thus, when the output from inverter M9 goes low, flip flop Q3 is cleared so that $\overline{Q}$ output of Q3 matches the output A from NAND gate U6:A.

As described above, the output Q of flip flop Q2 is input to the noninverting input of comparator U4:D. Reference voltage VREF 1 is applied to the inverting input of comparator U4:D, thereby forming a level detector using comparator U4:D. When the output Q from flip flop Q2 is below VREF1, a voltage path exists from 5V through resistor R35, LED2, and resistor R53 in parallel to ground, thereby illuminating LED2. When the output Q from flip flop Q2 exceeds VREF1, the output from comparator U4:D is high and no voltage potential across LED2 exists, thereby extinguishing LED2. The output signal from U4:D is also input to a Schmitt trigger NAND gate U7:A via an RC circuit formed using resistor R36 and capacitor C7. NAND gate U7:A provides an inverter function. The output from NAND gate U7:A is then input to NAND gate U7:B, the output of which is an active low representation of the increment or count signal.

In a preferred embodiment, counter/display 32 remains on for a predetermined time period after the operator has displaced GMR sensor 12 over the window grid. Accordingly, a power supply circuit 46 and latch circuit 48 cooperate to prevent an undesired increment of counter/display 32. Power supply circuit 46 enables an orderly power up and power down of window grid tester system 10 so that window grid tester system 10 operates only during and for a predetermined time after performing the test.

Figure 2F:
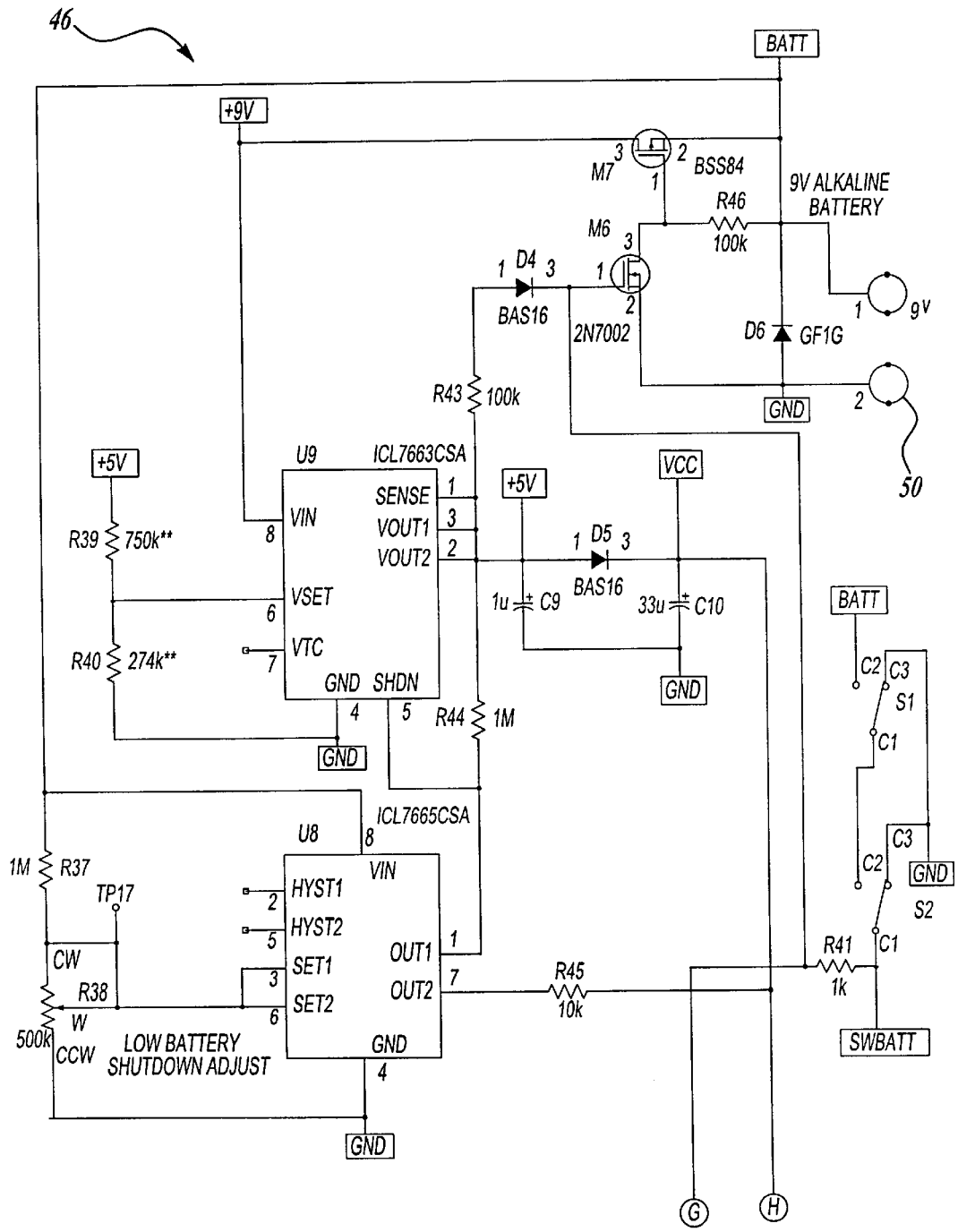

With reference to FIG. 2f, power supply circuit 46 will be described. Power to window grid tester system 10 is supplied via a 9V battery source 50. A diode D6 connects in parallel across battery source 50. Installation of a 9V battery source provides battery power to the voltage divider formed by resistor R37 and potentiometer R38. Potentiometer R38 is configured to input a test voltage which is input to the SET1 and SET2 inputs of voltage monitor U8. Voltage monitor U8 also receives battery power at pin VIN. If the voltage at pin SET1 drops below a predetermined threshold, the voltage at pin OUT1 goes high. If the voltage at pin SET2 drops below a predetermined threshold, the voltage at pin OUT2 drops to ground. Thus, voltage monitor U8 monitors the voltage output of battery source 50, and if the voltage of battery source 50 drops below a predetermined threshold, voltage at pins SET1 and SET2 will drop below a predetermined threshold voltage of 1.3 volts, thereby causing pin OUT1 to output a high voltage and pin OUT2 to output a low voltage.

In operation, a pair of switches S1, S2 are disposed on window grid tester system 10 so that when GMR sensor 12 is placed onto the window, both switches S1 and S2 must be activated. Switches S1 and S2 can only be activated if GMR sensor 12 is placed in proper orientation with respect to the window. Activation of switches S1 and S2 provides a voltage signal through resistor R41 to the gate of MOSFET M6 and to the drain of MOSFET M5 of FIG. 2e.

Applying a high voltage to the gate of MOSFET M6 provides a current path from the drain of M6 to ground. This current path pulls the voltage at the gate of MOSFET M7 low, thereby providing a current path between the source and drain of MOSFET M7 and thereby providing a 9V signal to pin VIN of voltage regulator U9. A 5V signal output by voltage regulator U9 powers a voltage divider formed by resistors R39 and R40. The output from the voltage divider is input to pin VSET of voltage regulator U9. Voltage regulator U9 outputs an approximately 5V signal from pin VOUT1 which is tied to output pin VOUT2 and the SENSE input. The 5V signal is supplied to the gate of MOSFET M6 through resistor R43 and diode D4. The 5V signal is also applied across diode D5 to generate voltage Vcc. Voltage Vcc builds through a stored charge that accumulates in capacitor C10.

With reference to FIG. 2e, once the 9V signal and VCC have been generated, the output of a voltage divider comprising resistors R47 and R48 is input to the gate of MOSFET M8, and the 5V signal is applied to the drain of MOSFET M8 through resistor R49. The output of the voltage divider formed by resistors R47 and R48 turns on MOSFET M8 which pulls pin 13 of NAND gate U7:D to ground, resulting in NAND gate U7:D generating a high voltage signal which is input to pin 5 of NAND gate U7:B and pin 9 of NAND gate U7:C. The high output of the voltage divider is also input to pin 10 of NAND gate U7:C, and NAND gate U7:C outputs a low voltage which is applied to pin 12 of NAND gate U7:D and to the latch pin of counter/display 32. The low output of NAND gate U7:C is also applied to the gate of MOSFET M5 through resistor R52 and capacitor C8 which forms a RC circuit with resistor R42. Thus, after power up, the latch signal to counter/display 32 remains inactive during operation. The input of a high voltage to pin 5 of NAND gate U7:B insures that the inverted increment signal output by NAND gate U7:A controls the count signal applied to the COUNT* pin of counter/display 32.

Once the GMR sensor 12 has been moved across the glass and has been taken off the glass, switches S1 and S2 open, thereby grounding the gate of MOSFET M6 and cutting off the current path between the gate of MOSFET M7 and ground. This disables voltage regulator U9. Thus, only the charge stored in capacitor C10 at Vcc provides power to the circuit elements. Capacitor C10 discharges over a period of approximately 30 seconds to power the counter/display 32 after shutdown of the circuit. Particularly, VCC continues to provide power to the drain of MOSFET M8 and NAND gates U7:A, U7:B, U7:C, and U7:D.

During this shutdown period, the 9V signal has been turned off, so that a low voltage signal is applied to the gate of MOSFET M8. The low voltage signal turns off M8 so that the voltage signal Vcc is applied to pin 13 of NAND gate U7:D through pull up resistor R49. During the shutdown period, because the output of the voltage divider comprising resistors R47 and R48 is low, a low voltage is applied to pin 10 of NAND gate U7:C, and NAND gate U7:C outputs a resultant high voltage. The high voltage from NAND gate U7:C is applied to pin 12 of NAND gate U7:D, and NAND gate U7:D outputs a low voltage which is input to pin 5 of NAND gate U7:B and pin 9 of NAND gate U7:C. The high voltage output by NAND gate U7:C is applied to the LATCH pin of counter/display 32, thereby preventing the counter from changing in response to an increment signal. Further, the low voltage signal applied to pin 5 of NAND gate U7:B results in a high voltage signal being output from NAND gate U7:B and applied to the COUNT* pin of counter/display 32. The high voltage signal applied to the COUNT* pin of counter/display 32 prevents an increment signal from being applied to the pin, which provides redundant protection with the latch signal. The high output from NAND gate U7:C is also applied to the gate of MOSFET M5 via resistor R52 and the RC circuit including capacitor C8 and R42, thereby turning on MOSFET M5 and actibely discharging capacitor C9.

In view of the foregoing, one can see that the invention described herein provides an improved method for detecting electrical current and the electrical conductors of a heater grid. In particular, the subject invention accomplishes this goal utilizing only one magnetic field sensor, rather than the two magnetic field sensors which are typically used in such application. Further, the subject invention utilizes the delay elements to provide a delayed representation and distance of the signal output by the giant magneto resistive sensor. The delayed circuit allows elimination of an additional sensor.

While specific embodiments have been shown and described in detail to illustrate the principles of the present invention, it will be understood that the invention may be embodied otherwise without departing from such principles. For example, one skilled in the art will readily recognize from such discussion and from the accompanying drawings and claims that various changes, modifications and variations can be made therein without departing from the spirit and scope of the invention as described in the following claims.

What is claimed is:

1. An apparatus for detecting energization of individual electrical conductors of a plurality of generally parallel, adjacent electrical conductors, comprising:

a magnetic sensor passed over the electrical conductors, the magnetic sensor generating an output signal in accordance with variation in the magnetic field as the sensor passes over the electrical conductors;

a delay element, the delay element receiving the output signal and delaying the output signal for a predetermined period to define a delay signal;

an adder, the adder determining the difference between the output signal and the delay signal to define a difference signal;

a high window comparator, the high window comparator determining whether the difference signal is above a predetermined threshold and generating a high window signal in accordance therewith;

a low window comparator, the low window comparator determining whether the difference signal is below a predetermined threshold and generating a low window signal in accordance therewith;

a control circuit, the control circuit comparing the high window signal and the low window signal and generating an increment signal in accordance with the low and high window signals; and a counter receiving the increment signal, the counter incrementing in accordance with the increment signal.

2. The apparatus of claim 1 wherein an energized electrical conductor generates a first waveform component in the output signal and a deenergized electrical conductor generates a second waveform component in the output signal.

3. The apparatus of claim 2 wherein the increment signal varies in accordance with the relative positions of the first and second waveform components.

4. The apparatus of claim 3 wherein the counter increments if the sensor has passed over an energized electrical conductor.

5. The apparatus of claim 1 wherein the counter increments if the sensor has passed over an energized electrical conductor.

6. The apparatus of claim 1 wherein displacement of the sensor defines the predetermined period.

7. The apparatus of claim 1 wherein the magnetic sensor is a giant magnetoresistive sensor.

8. The apparatus of claim 1 wherein the difference signal includes positive and negative peaks, and the control logic generates the increment signal in accordance with a predetermined pairing of the positive and negative peaks.

9. A method of detecting energization of individual electrical conductors of a plurality of generally parallel, adjacent electrical conductors, comprising:

passing a magnetic sensor over the electrical conductors to generate an output signal in accordance with a variance in the magnetic field as the sensor passes over the electrical conductors;

delaying the output signal for a predetermined period to define a delay signal;

determining the difference between the output signal and the delay signal to define a difference signal;

comparing the difference signal to a high threshold to determine whether the difference signal exceeds the high threshold and generating a high window signal in accordance therewith;

comparing the difference signal to a low threshold to determine whether the difference signal exceeds the low threshold and generating a low window signal in accordance therewith; and comparing the high window signal and the low window signal and generating an increment signal in accordance with the low and high window signals.

10. The method of claim 9 further comprising the step of incrementing a counter in accordance with the increment signal.

11. The method of claim 10 wherein the sensor outputs a first waveform component when passing over an energized electrical conductor and outputs a second waveform component when passing over a deenergized electrical conductor.

12. The method of claim 11 further comprising the step of varying the increment signal in accordance with the relative positions of the first and second waveform components.

13. The method of claim 12 further comprising the step of incrementing the counter if the sensor has passed over an energized electrical conductor.

14. The method of claim 10 further comprising the step of incrementing the counter if the sensor has passed over an energized electrical conductor.

15. The method of claim 9 wherein the step of displacing the sensor defines the predetermined period in accordance with the distance displaced by the sensor.

16. The method of claim 9 wherein step of displacing the sensor further comprises displacing a giant magnetoresistive sensor over the electrical conductors.

17. The method of claim 9 wherein the difference signal includes positive and negative peaks, and the control logic generates the increment signal in accordance with a predetermined pairing of the positive and negative peaks.

* * * * *